US012811374B2

(12) United States Patent
Li et al.

(10) Patent No.: US 12,811,374 B2
(45) Date of Patent: Nov. 24, 2026

(54) HEAT DISSIPATING DEVICE FOR ELECTRICAL CABINET AND ELECTRICAL CABINET

(71) Applicant: Schneider Electric (China) Co., Ltd., Beijing (CN)

(72) Inventors: Ning Li, Beijing (CN); Jiaojiao Ding, Beijing (CN); Baoyun Bi, Beijing (CN); Huaying Li, Beijing (CN); Hongzhi Sun, Beijing (CN); Xiaoqiang Li, Beijing (CN); Kun Liu, Beijing (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 299 days.

(21) Appl. No.: 18/528,343

(22) Filed: Dec. 4, 2023

(65) Prior Publication Data

US 2025/0132542 A1 Apr. 24, 2025

(30) Foreign Application Priority Data

Oct. 20, 2023 (CN) ........................ 202322822291.X

(51) Int. Cl.
*H02B 1/56* (2006.01)
*H05K 7/20* (2006.01)

(52) U.S. Cl.
CPC ......... *H02B 1/565* (2013.01); *H05K 7/20136* (2013.01)

(58) Field of Classification Search
CPC . H02B 1/565; H05K 7/20136; H05K 7/20572
See application file for complete search history.

(56) References Cited

U.S. PATENT DOCUMENTS 5,398,159 A 3/1995 Andersson et al.
5,504,458 A 4/1996 Van Brunt et al.
(Continued)

FOREIGN PATENT DOCUMENTS

DE 2638118 A1 3/1978
DE 19728306 A1 1/1999
(Continued)

OTHER PUBLICATIONS

JP2013183146 and translation (Year: 2013).*
(Continued)

*Primary Examiner* — Steven S Anderson, II
(74) *Attorney, Agent, or Firm* — FIG. 1 Patents

(57) ABSTRACT

Embodiments of the present disclosure provides a heat dissipating device for an electrical cabinet and the electrical cabinet. The electrical cabinet comprises a cabinet body and a plurality of drawers. The plurality of drawers are inserted into the cabinet body from a front side of the cabinet body in a thickness direction of the cabinet body and arranged along a height direction of the cabinet body. The heat dissipating device comprises a first air inlet and a second air inlet. The first air inlet is arranged on a front side of the cabinet body between two adjacent drawers of the plurality of drawers to receive a first cooling airflow. The second air inlet is arranged on a front side of the cabinet body adjacent to a bottom of the cabinet body to receive a second cooling airflow. The heat dissipating device further comprise an isolation assembly arranged in the cabinet body to isolate the first and second cooling airflows.

10 Claims, 2 Drawing Sheets

(56) References Cited

U.S. PATENT DOCUMENTS

| | | | | |
|---|---|---|---|---|
| 7,061,759 | B2 | 6/2006 | Karppinen et al. | |
| 7,123,477 | B2 | 10/2006 | Coglitore et al. | |
| 7,182,208 | B2 | 2/2007 | Tachibana | |
| 7,508,663 | B2 | 3/2009 | Coglitore | |
| 8,115,145 | B2 | 2/2012 | Shariff et al. | |
| 8,405,985 | B1 | 3/2013 | Reynov et al. | |
| 8,767,400 | B2 | 7/2014 | Dickinson et al. | |
| 10,058,011 | B2 | 8/2018 | Graczyk et al. | |
| 2004/0257766 | A1 | 12/2004 | Rasmussen et al. | |
| 2006/0223433 | A1* | 10/2006 | Matsuzawa ........ | H05K 7/20563 454/184 |
| 2017/0245396 | A1* | 8/2017 | Bilski, Jr. .......... | H05K 7/20445 |

FOREIGN PATENT DOCUMENTS

| | | | | |
|---|---|---|---|---|
| EP | 2071910 | A1 * | 6/2009 | ......... H05K 7/20009 |
| EP | 2100490 | A1 | 9/2009 | |
| JP | 2013183146 | A * | 9/2013 | |
| WO | 2014083078 | A1 | 6/2014 | |

OTHER PUBLICATIONS

Extended European Search Report dated May 14, 2024 for corresponding European Patent Application No. 23214104.4-1201, 12 pages.

Extended European Search Report dated May 23, 2024 for corresponding European Patent Application No. 23214053.3-1201, 10 pages.

Non-Final Office Action dated Jun. 5, 2025 from U.S. Appl. No. 18/528,246, 13 pages.

* cited by examiner

HEAT DISSIPATING DEVICE FOR ELECTRICAL CABINET AND ELECTRICAL CABINET

FIELD

Embodiments of the present disclosure relate to the field of electrical equipment, and more particularly, to a heat dissipating device for an electrical cabinet and the electrical cabinet.

BACKGROUND

With the development of electronic technology, the high-density installation of electronic devices in electrical cabinets has become a trend, which leads to an increasing number of electronic devices in electrical cabinets, resulting in an increasing amount of heat generated by electronic devices in electrical cabinets. The current electrical cabinets cannot meet the heat dissipation requirements under high-density installation, which will affect the performance and reliability of the equipment. Therefore, it is necessary to optimize the design.

SUMMARY

Embodiments of the present disclosure provide a heat dissipating device for an electrical cabinet and an electrical cabinet, to at least partially solve the above problems.

In a first aspect of the present disclosure, there is provided a heat dissipating device for an electrical cabinet, the electrical cabinet comprising a cabinet body and a plurality of drawers, the plurality of drawers inserted into the cabinet body from a front side of the cabinet body in a thickness direction of the cabinet body and arranged along a height direction of the cabinet body, wherein the heat dissipating device comprises: a first air inlet and a second air inlet, the first air inlet arranged on the front side of the cabinet body between two adjacent drawers of the plurality of drawers to receive a first cooling airflow, the second air inlet arranged on the front side of the cabinet body adjacent to a bottom of the cabinet body to receive a second cooling airflow; and an isolation assembly arranged within the cabinet body to isolate the first cooling airflow and the second cooling airflow.

In the embodiment according to the present disclosure, the first cooling airflow and the second cooling airflow are isolated by using an isolation assembly. The temperature influence between the drawers can be avoided, which helps to cope with the challenge of increased heat generation of the device in high-density environments and maintains the performance and reliability of the device. Other benefits will be described below in conjunction with the corresponding embodiments.

In some embodiments, the heat dissipating device further comprises a plurality of drawer vents, each of the plurality of drawer vents arranged between adjacent drawers of the plurality of drawers, for the first cooling airflow and the second cooling airflow to flow between different drawers. In such embodiments, the first cooling airflow and the second cooling airflow can sufficiently take away the heat generated by the electronic components in each drawer through the drawer vent.

In some embodiments, the isolation assembly comprises a pair of side isolation plates respectively arranged adjacent to opposite sides of the plurality of drawers in a width direction of the cabinet body to guide the first cooling airflow and the second cooling airflow to flow to the plurality of drawer vents. In such embodiments, by using the side isolation plate, it is possible to prevent the first cooling airflow and the second cooling airflow to both sides of the cabinet body.

In some embodiments, the isolation assembly further comprises a bottom isolation plate. One end of the bottom isolation plate abuts a drawer of the plurality of drawers which is adjacent to the bottom of the cabinet body and the other end abuts the bottom of the cabinet body to guide the second cooling airflow received by the second air inlet to flow to the plurality of drawer vents. In such embodiments, by using the bottom isolation plate, it is possible to prevent the second cooling airflow directly entering from the bottom of the cabinet body to the inside of the cabinet body where no drawer is installed.

In some embodiments, the isolation assembly further comprises a pair of thermal isolation plates, the pair of thermal isolation plates arranged between the first air inlet and a drawer of the two adjacent drawers which is closer to the bottom of the cabinet body, the pair of thermal isolation plates arranged along a width direction of the cabinet body and spaced from each other by a predetermined distance to isolate the first cooling airflow and the second cooling airflow. In such embodiments, by using a pair of thermal isolation plates, it is possible to reliably prevent heat exchange between the first cooling airflow and the second cooling airflow.

In some embodiments, the heat dissipating device further comprises a through hole arranged adjacent to a side of the pair of thermal isolation plates away from the front side of the cabinet body, for the second cooling airflow to pass through. In such embodiments, the use of the through hole can be sufficiently guide the second cooling airflow to be discharged from the drawer.

In some embodiments, the heat dissipating device further comprises a first air outlet and a second air outlet, the first air outlet arranged on the front side of the cabinet body adjacent to a top of the cabinet body to guide the first cooling airflow flowing through the plurality of drawers to be discharged from the cabinet body, the second air outlet arranged on a rear side of the cabinet body adjacent to the top of the cabinet body to guide the second cooling airflow flowing through the plurality of drawers and through holes to be discharged from the cabinet body. In such embodiments, by using the first air outlet and the second air outlet can be reliably guide the first cooling airflow and the second cooling airflow to carry heat out of the cabinet body.

In a second aspect of the present disclosure, there is provided an electrical cabinet comprising a heat dissipating device according to the first aspect of the present disclosure.

It should be understood that the content described in this section is not intended to limit critical or important features of the embodiments of the present disclosure, nor is it used to limit the scope of the present disclosure. Other features of the present disclosure will become easier to be understood through the following description.

BRIEF DESCRIPTION OF THE DRAWINGS

In conjunction with the accompanying drawings and with reference to the following detailed description, the above and other features, advantages and aspects of the various embodiments of the present disclosure will become more apparent.

DETAILED DESCRIPTION

Figure 1:
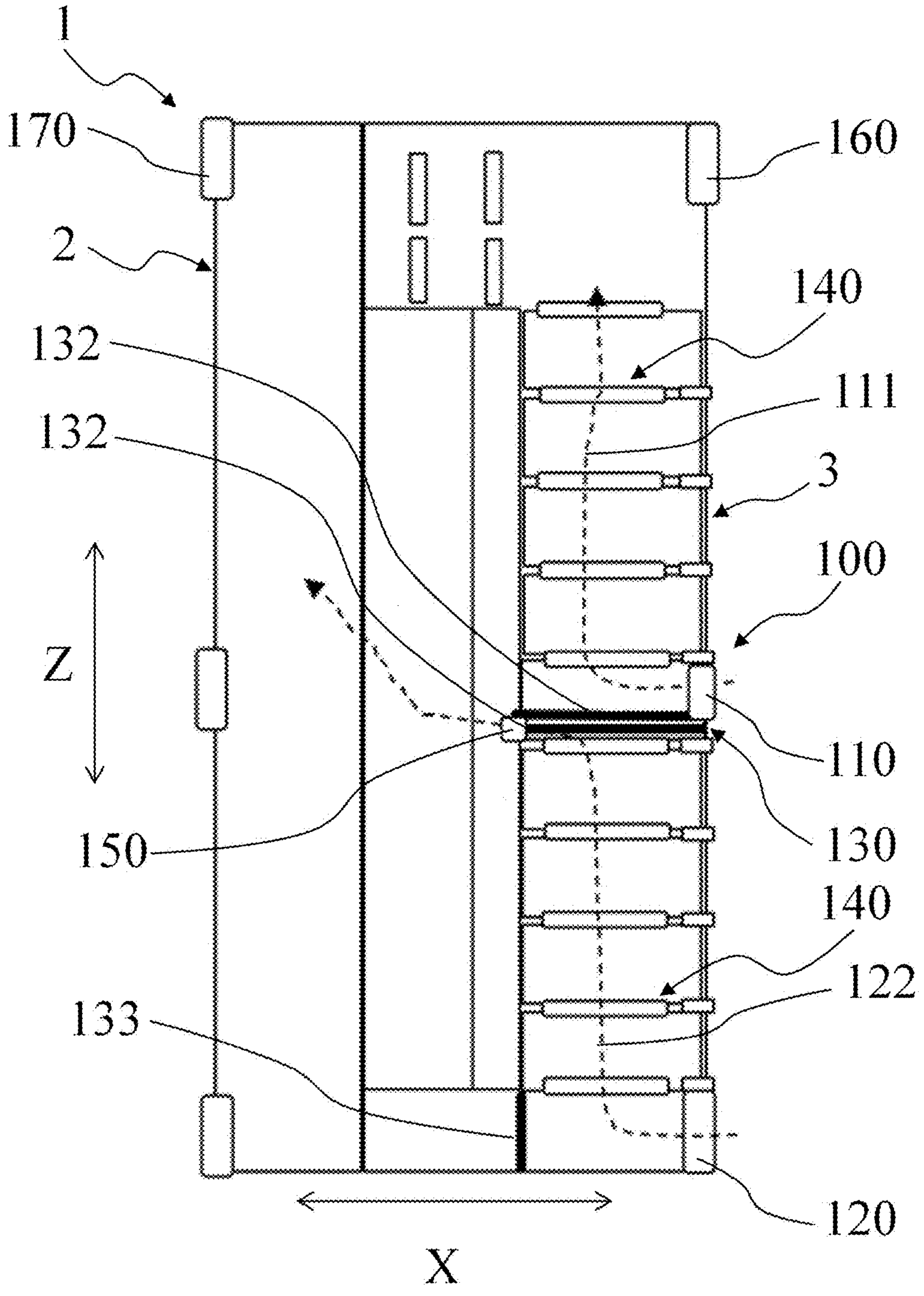
FIG. 1 shows a left side view of an electrical cabinet according to one embodiment of the present disclosure.

Preferred embodiments of the present disclosure will be described in more detail below with reference to the accompanying drawings. Although preferred embodiments of the present disclosure are shown in the drawings, it should be understood that the present disclosure may be implemented in various forms and should not be limited by the embodiments set forth herein. Instead, these embodiments are provided to make the present disclosure more thorough and complete, and to fully convey the scope of the present disclosure to those skilled in the art.

The term "including" and its variations used in this article indicate open-ended inclusion, that is, "including but not limited to". Unless otherwise stated, the term "or" means "and/or". The term "based on" means "at least partially based on". The terms "one example embodiment" and "one embodiment" mean "at least one example embodiment". The term "another embodiment" means "at least one additional embodiment". The terms "first", "second", etc. can refer to different or identical objects.

As mentioned briefly earlier, high-density installation is a trend for electronic devices in electrical cabinets. High-density installation of electronic devices such as solid-state starters not only saves space and cost, but also has a compact structure, which can bring small footprint and weight, efficient installation, easy processing, easy assembly, and high reliability. These advantages also make the high-density application of solid-state starters more and more common.

However, solid-state starters usually have higher power density, which means that more heat will be generated in a limited space, making the heat dissipation requirements more complex and challenging. In traditional electrical cabinets used to accommodate solid-state starters, without a proper heat dissipation system, high-power density devices may cause the internal temperature to rise to dangerous levels. For example, for a single starter with a power of 11 W/16 A, if there is no proper heat dissipation and ventilation, the internal temperature may reach as high as 110° C. at an ambient temperature of 35° C. Such a high-temperature environment poses a risk of damage to the MOSFET (metal oxide semiconductor field-effect transistor) in the device. With the impact of short-circuit current, the temperature of the MOSFET may even rise above 170° C., which will greatly reduce its lifespan and reliability. Excessive temperature will increase the thermal stress inside the device, which may cause faults and damage.

In order to solve or at least partially solve the above problems or other potential problems of the conventional electrical cabinet embodiment of the present disclosure provides a heat dissipating device for the electrical cabinet 1 and the electrical cabinet 1 100.

Electrical cabinet 1 is a cabinet for accommodating heating components such as solid-state starters. The electrical cabinet 1 comprises a cabinet body 2, a plurality of drawers 3, and a heat dissipating device 100. The drawers 3 are used to accommodate heating components such as solid-state starters. The plurality of drawers 3 are inserted from the front side of the cabinet body 2 in the thickness direction (X) of the cabinet body 2, and the plurality of drawers 3 are arranged along the height direction (Z) of the cabinet body 2. The heat dissipating device 100 can provide good air flow and heat dissipation effects to ensuring that the devices in the drawers 3 remain within a suitable temperature range during operation. This can prevent equipment performance degradation, malfunction or even damage due to overheating.

Further, by properly arranging the airflow passage, the air in the electrical cabinet 1 can flow along a proper flow path (see the dashed arrow shown in the figure) to ensure that the hot air can be effectively discharged, and the cold air can flow to the critical parts of the device.

Figure 2:
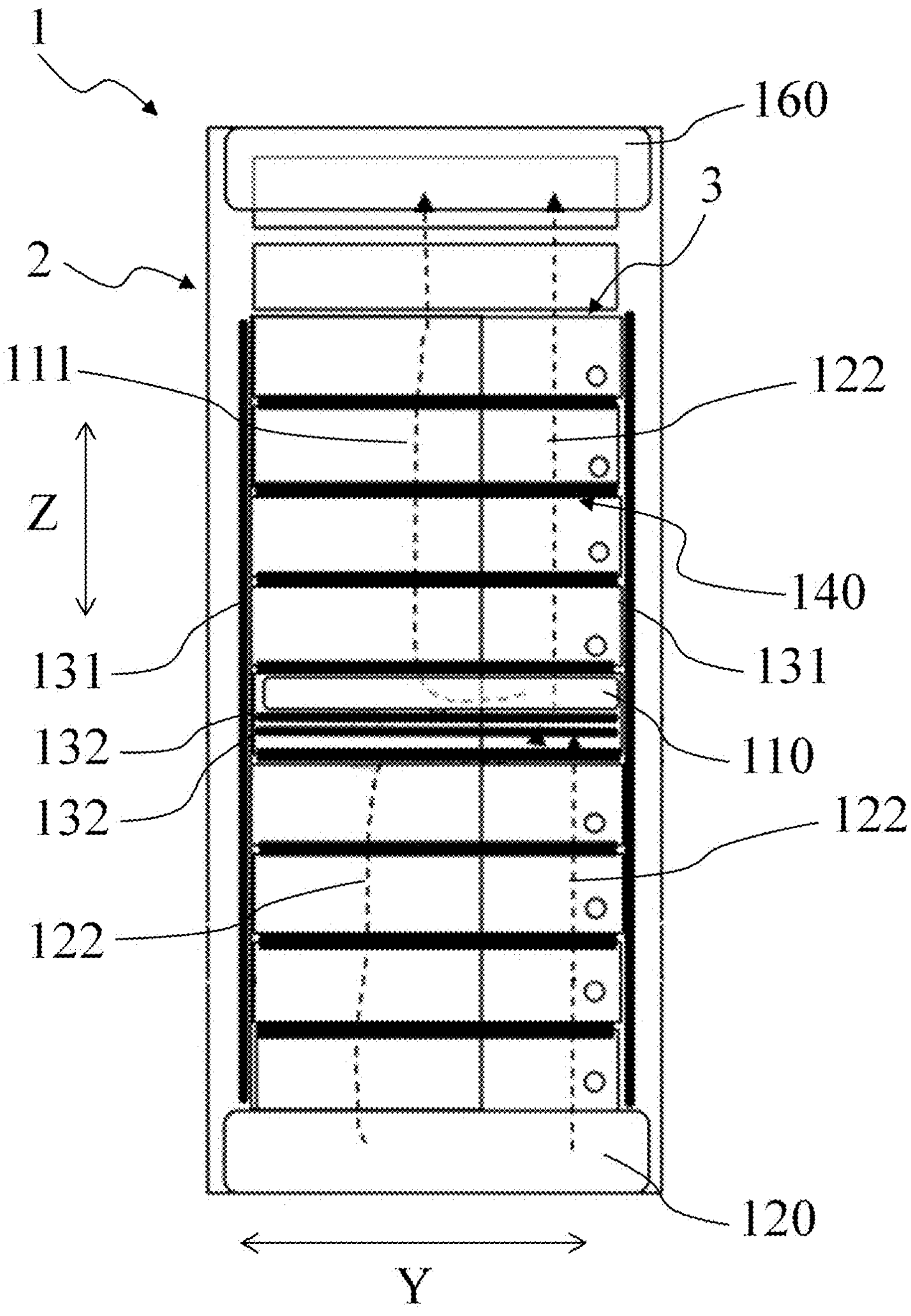
FIG. 2 shows a front view of an electrical cabinet according to one embodiment of the present disclosure.

FIG. 1 shows a left view of an electrical cabinet according to one embodiment of the present disclosure. FIG. 2 shows a front view of an electrical cabinet according to one embodiment of the present disclosure. An example structure of the heat dissipating device 100 of the electrical cabinet 1 will be described below in conjunction with FIGS. 1 and 2. The heat dissipating device 100 according to embodiments of present disclosure comprises a first air inlet 110 and a second air inlet 120. The first air inlet 110 is provided between two adjacent drawers 3 of the plurality of drawers 3, and the first air inlet 110 is arranged on the front side of the cabinet body 2 to receive the first cooling airflow 111. The second air inlet 120 is arranged adjacent to the bottom of the cabinet body 2, and the second air inlet 120 is arranged on the front side of the cabinet body 2 to receive the second cooling airflow 122. In some embodiments, the first cooling airflow 111 is of a room temperature (e.g., 35° C.), and the second cooling airflow 122 is of a low temperature (e.g., lower than 35° C.) airflow. In addition, the first cooling airflow 111 and the second cooling airflow 122 can be driven by an external device such as a fan. It should be understood that based on the teaching given by the present disclosure, those skilled in the art can think of other types of external devices that drive the first cooling airflow 111 and the second cooling airflow 122, all of which fall within the scope of this disclosure.

Still in reference to FIGS. 1 to 2, in some embodiments, the heat dissipating device 100 further comprises a first air outlet 160 corresponding to the first air inlet 110 and a second air outlet 170 corresponding to the second air inlet 120. The first air outlet 160 is arranged adjacent to the top of the cabinet body 2, and the first air outlet 160 is arranged on the front side of the cabinet body, thereby guiding the first cooling airflow 111 which flows through the plurality of drawers 3 to be discharged from the cabinet body 2. The second air outlet 170 is arranged adjacent to the top of the cabinet body 2, and the second air outlet 170 is arranged on the rear side of the cabinet body 2, thereby guiding the second cooling airflow 122 which flows through the plurality of drawers 3 to be discharged from the cabinet body 2.

Further, the first cooling airflow 111 and the second cooling airflow 122 work separately, and the drawers 3 may comprise upper drawers located above the first air inlet 110 and lower drawers located below the first air inlet 110. The first cooling airflow 111 passes through the upper drawers, and the second cooling airflow 122 passes through the lower drawers. Apparently, considering that the hot air flow has lower density, arranging the air outlet at the top of the cabinet body 2 is more conducive to airflow and heat dissipation of the cabinet body 2.

It should be understood that the "front" and "rear" in this article can be relative to the horizontal direction in the previous text. For the cabinet, the front side represents the side used by the user to access and place the drawer 3, and the rear side is the opposite side.

In some embodiments, the isolation assembly 130 is provided in the cabinet body 2 to isolate the first cooling airflow 111 and the second cooling airflow 122. With the above arrangement, the influence of temperature among the drawers 3 can be avoided. In this way, it is possible to better cope with the challenge of increasing the heat generation of the device in a high-density environment and to maintain the performance and reliability of the device.

In some embodiments, each of the plurality of drawer vents 140 is arranged between adjacent drawers 3, so that the first cooling airflow 111 and the second cooling airflow 122 flow among different drawers 3. Apparently, embodiments of the present disclosure can allow the maximum cooling airflow into the drawers 3 by optimizing the opening area and the opening ratio, thereby taking away more heat in the drawers 3.

It is to be noted that along the thickness direction (X) of the cabinet body 2, the distance between the projection of a drawer 3 from the lower drawers which is closest to the first air inlet 110 and the projection of the first air inlet 110 can be 30 mm. With the above arraignment, good thermal insulation can be achieved, and temperature influence between the lower drawer and the upper drawer can be avoided.

In some embodiments, the isolation assembly 130 further comprises a pair of thermal isolation plates 132 that are arranged between the first air inlet 110 and a drawer from the two adjacent drawer 3 which is closer to the bottom of the cabinet body 2. The pair of thermal isolation plates 132 are arranged along the width direction (Y) of the cabinet body 2, and the pair of thermal isolation plates 132 are spaced from each other by a predetermined distance to isolate the first cooling airflow 111 and the second cooling airflow 122. The predetermined distance between the pair of thermal isolation plates 132 can be 10 mm, for example. Apparently, the pair of thermal isolation plates 132 can provide heat insulation of the first cooling airflow 111 and the second cooling airflow 122, thereby preventing thermal short circuits.

Further, the isolation assembly 130 further comprises a pair of side isolation plates 131. The pair of side isolation plates 131 are arranged respectively adjacent to the opposite sides of the plurality of drawers 3 in the width direction (Y) of the cabinet body 2. The pair of side isolation plates 131 can guide the first cooling airflow 111 and the second cooling airflow 122 to flow to the plurality of drawer vents 140. It can be understood that the side isolation plate 131 can prevent the cooling airflow from flowing out between it and the two side walls of the drawer 3, thereby closing the two side air ducts of the electrical cabinet 1 and allowing the cooling airflow to flow out from a drawer vent 140 that is located in the middle of the drawers 3, thereby taking away more heat.

Further, the isolation assembly 130 further comprises a bottom isolation plate 133. One end of the bottom isolation plate 133 abuts one of the plurality of drawers 3 which is adjacent to the bottom of the cabinet body 2, and the other end of the bottom isolation plate 133 abuts the bottom of the cabinet body 2. The bottom isolation plate 133 can not only prevent the second cooling airflow 122 from flowing directly from the bottom of the cabinet body 2 to the rear side of the cabinet body 2, but also guide the second cooling airflow 122 received by the second air inlet 120 to sufficiently flow to the plurality of drawer vents 140. In some embodiments, by use of the bottom isolation plate 133, cooling airflow flowing into the drawer 3 can increase 28.5%, so as to better take away the heat in the drawer 3.

Referring back to FIG. 1, in some embodiments, the heat dissipating device 100 further comprises a through hole 150. The through hole 150 is provided within the cabinet body 2 and arranged adjacent to a side of the pair of thermal isolation plates 132 away from the front side of the cabinet body 2. The through hole 150 is used to guide the second cooling airflow 122 to pass through and guide the second cooling airflow 122 to flow out from the second air outlet 170.

In some embodiments, for a single power of 11 W/16 A solid state starter, in the case of an ambient temperature of 35° C., simulation analysis is performed to compare the dissipation effects of the electrical cabinet 1 according to embodiments of the present disclosure and conventional electrical cabinet where only a cabinet body heat dissipation channel is provided. First, the simulation results of the conventional electrical cabinet are analyzed. Since there is no drawer heat dissipation channel between the drawers in the conventional electrical cabinet, the heat generating members within a plurality of drawers interact with each other, the temperature difference between the front and rear walls of the drawer is relatively large, resulting in poor heat dissipation of the electrical cabinet. For example, the temperature of the front wall of the first conventional drawer adjacent to the second air inlet of the cabinet body is 95.7° C. The temperature of the front wall of the second conventional drawer adjacent to the first conventional drawer is 100° C. The temperature of the rear walls of the first conventional drawer and the second conventional drawer is 38.3° C. The temperature of the front wall of the third conventional drawer adjacent to the second conventional drawer is 103.3° C. The temperature of the front wall of the fourth conventional drawer adjacent to the third conventional drawer is 103.9° C. The temperature of the rear walls of the third conventional drawer and the fourth conventional drawer is 47.5° C. The temperature of the front wall of the first conventional drawer adjacent to the first air inlet of the cabinet body is 105.1° C. The temperature of the rear wall of the fifth conventional drawer is 56° C. The temperature of the front wall of the sixth conventional drawer adjacent to the fifth conventional drawer is 113.7° C. The temperature of the front wall of the seventh conventional drawer adjacent to the sixth conventional drawer is 117.4° C. The temperature of the rear walls of the sixth conventional drawer and the seventh conventional drawer is 63.7° C. The temperature of the front wall of the eighth conventional drawer of the air outlet is 119° C. The temperature of the rear wall of the eighth conventional drawer is 70.1° C., and the temperature of its top wall is 85.7° C.

The simulation results of the electrical cabinet 1 according to embodiments of the present disclosure are analyzed as well. Since drawer vents 140 are provided between adjacent drawers 3 of the plurality of drawers 3, each drawer 3 can be dissipated by the corresponding drawer vent 140. In this way, the temperature difference between the front and rear walls of each drawer 3 is low, and the electrical cabinet 1 has a good heat dissipation effect. For example, the temperature of the front wall of the first drawer adjacent to the second air inlet 120 of the cabinet body 2 is 70.0° C. The temperature of the front wall of the second drawer adjacent to the first drawer is 77.1° C. The temperature of the rear walls of the first drawer and the second drawer is 45.1° C. The temperature of the front wall of the third drawer adjacent to the second drawer is 83.4° C. The temperature of the front wall of the fourth drawer adjacent to the third drawer is 95.3° C. The temperature of the rear wall of the third drawer and the fourth drawer is 51.1° C.; the temperature of the front wall of the fifth drawer adjacent to the first air inlet 110 of the cabinet body 2 is 66.4° C. The temperature of the rear wall of the fifth drawer is 60.0° C. The temperature of the front wall of the sixth drawer adjacent to the fifth drawer is 74.8° C. The temperature of the front wall of the seventh drawer adjacent to the sixth drawer is 84.1° C. The temperature of the rear walls of the sixth drawer and the seventh drawer is 62.9° C. The temperature of the front wall of the eighth drawer adjacent to the seven drawer and the first air outlet 160 is 93.8° C. The temperature of the rear wall of the eighth drawer is 66.9° C., and the temperature of its top wall is 88.0° C. Therefore, compared with the traditional electrical cabinet, the temperature of the drawers 3 of the electrical cabinet 1 according to embodiments of the present disclosure is reduced, so that the devices in the drawers 3 can effectively dissipate heat to meet the safe operation of the equipment under high-density installation.

In summary, according to embodiments of the present disclosure, the first cooling airflow 111 and the second cooling airflow 122 are isolated by the isolation assembly 130. The temperature influence between the drawers 3 can be avoided, which helps to cope with the challenge of increasing the heat generation of the device in a high-density environment and maintains the performance and reliability of the device. In addition, the air duct structure of the electrical cabinet 1 according to embodiments of the present disclosure is relatively simple and is suitable for natural ventilation and forced ventilation. Moreover, the side isolation plate 131, the bottom isolation plate 133, and the thermal isolation plate 132 in embodiments of the present disclosure embodiment each can include sheet metal parts, which are easy to process, easy to assemble, and have low cost and higher reliability.

In a second aspect of the present disclosure, there is provided an electrical cabinet 1, comprising a heat dissipating device 100 according to a first aspect of the present disclosure.

Electrical cabinet 1 plays a crucial role in protecting equipment, improving reliability, and extending life. They not only effectively dissipate heat to prevent equipment overheating, but also have functions such as dustproof, waterproof, and shockproof, which can protect equipment from external environmental interference and damage. The electrical cabinet 1 according to embodiments of the present disclosure can be applied to the heat dissipation of various solid-state starters. It should be understood that the electrical cabinet 1 according to embodiments of the present disclosure can also be applied to other electrical components, and embodiments of the present disclosure is not limited to this.

The foregoing has described various embodiments of the present disclosure, the foregoing description is exemplary, not exhaustive, and is not limited to embodiments of the present disclosures. Without departing from the scope and spirit of the illustrated embodiments, many modifications and changes will be apparent to those of ordinary skill in the art. The terminology used herein is intended to best explain the principles, practical applications, or technical improvements in the market of each embodiment, or to enable others of ordinary skill in the art to understand the embodiments disclosed herein.

What is claimed is:

1. A heat dissipating device for an electrical cabinet, the electrical cabinet comprising a cabinet body and a plurality of drawers, the plurality of drawers inserted into the cabinet body from a front side of the cabinet body in a thickness direction of the cabinet and arranged along a height direction of the cabinet body, the heat dissipating device comprises:

a first air inlet and a second air inlet, the first air inlet arranged on the front side of the cabinet body between two adjacent drawers of the plurality of drawers to receive a first cooling airflow, the second air inlet arranged on the front side of the cabinet body adjacent to a bottom of the cabinet body to receive a second cooling airflow;

an isolation assembly arranged within the cabinet body to isolate the first cooling airflow and the second cooling airflow, wherein the isolation assembly comprises a pair of thermal isolation plates arranged between the first air inlet and a drawer of the two adjacent drawers which is closer to the bottom of the cabinet body;

a through hole arranged adjacent to a side of the pair of thermal isolation plates away from the front side of the cabinet body, for the second cooling airflow to pass through; and a first air outlet and a second air outlet, the first air outlet arranged on the front side of the cabinet body adjacent to a top of the cabinet body to guide the first cooling airflow flowing through the plurality of drawers to be discharged from the cabinet body, the second air outlet arranged on a rear side of the cabinet body adjacent to the top of the cabinet body to guide the second cooling airflow flowing through the plurality of drawers and the through hole to be discharged from the cabinet body.

2. The heat dissipating device of claim 1, wherein the heat dissipating device further comprises a plurality of drawer vents, each of the plurality of drawer vents arranged between adjacent drawers of the plurality of drawers for the first cooling airflow and the second cooling airflow to flow between different drawers.

3. The heat dissipating device of claim 2, wherein the isolation assembly comprises a pair of side isolation plates respectively arranged adjacent to opposite sides of the plurality of drawers in a width direction of the cabinet body to guide the first cooling airflow and the second cooling airflow to flow to the plurality of drawer vents.

4. The heat dissipating device of claim 2, wherein the isolation assembly further comprises a bottom isolation plate, one end of the bottom isolation plate abutting a drawer of the plurality of drawers which is adjacent to the bottom of the cabinet body and another end abutting the bottom of the cabinet body to guide the second cooling airflow received by the second air inlet to flow to the plurality of drawer vents.

5. The heat dissipating device of claim 1, wherein the pair of thermal isolation plates is arranged along a width direction of the cabinet body and spaced from each other by a predetermined distance to isolate the first cooling airflow and the second cooling airflow.

6. An electrical cabinet comprising:

a cabinet body and a plurality of drawers, the plurality of drawers inserted into the cabinet body from a front side of the cabinet body in a thickness direction of the cabinet and arranged along a height direction of the cabinet body; and a heat dissipating device comprising:

a first air inlet and a second air inlet, the first air inlet arranged on the front side of the cabinet body between two adjacent drawers of the plurality of drawers to receive a first cooling airflow, the second air inlet arranged on the front side of the cabinet body adjacent to a bottom of the cabinet body to receive a second cooling airflow;

an isolation assembly arranged within the cabinet body to isolate the first cooling airflow and the second cooling airflow, wherein the isolation assembly comprises a pair of thermal isolation plates arranged between the first air inlet and a drawer of the two adjacent drawers which is closer to the bottom of the cabinet body:

a through hole arranged adjacent to a side of the pair of thermal isolation plates away from the front side of the cabinet body, for the second cooling airflow to pass through; and a first air outlet and a second air outlet, the first air outlet arranged on the front side of the cabinet body adjacent to a top of the cabinet body to guide the first cooling airflow flowing through the plurality of drawers to be discharged from the cabinet body, the second air outlet arranged on a rear side of the cabinet body adjacent to the top of the cabinet body to guide the second cooling airflow flowing through the plurality of drawers and the through hole to be discharged from the cabinet body.

7. The electrical cabinet of claim 6, wherein the heat dissipating device further comprises a plurality of drawer vents, each of the plurality of drawer vents arranged between adjacent drawers of the plurality of drawers for the first cooling airflow and the second cooling airflow to flow between different drawers.

8. The electrical cabinet of claim 7, wherein the isolation assembly comprises a pair of side isolation plates respectively arranged adjacent to opposite sides of the plurality of drawers in a width direction of the cabinet body to guide the first cooling airflow and the second cooling airflow to flow to the plurality of drawer vents.

9. The electrical cabinet of claim 7, wherein the isolation assembly further comprises a bottom isolation plate, one end of the bottom isolation plate abutting a drawer of the plurality of drawers which is adjacent to the bottom of the cabinet body and another end abutting the bottom of the cabinet body to guide the second cooling airflow received by the second air inlet to flow to the plurality of drawer vents.

10. The electrical cabinet of claim 6, wherein the pair of thermal isolation plates is arranged along a width direction of the cabinet body and spaced from each other by a predetermined distance to isolate the first cooling airflow and the second cooling airflow.

* * * * *